US009551770B1

(12) United States Patent
Nasiraei Moghaddam

(10) Patent No.: US 9,551,770 B1
(45) Date of Patent: Jan. 24, 2017

(54) FUNCTIONAL MAGNETIC RESONANCE IMAGING BY SPATIALLY MODULATING STEADY-STATE SIGNAL IN STEADY-STATE FREE PRECESSION

(71) Applicant: Abbas Nasiraei Moghaddam, Tehran (IR)

(72) Inventor: Abbas Nasiraei Moghaddam, Tehran (IR)

( * ) Notice: Subject to any disclaimer, the term of this patent is extended or adjusted under 35 U.S.C. 154(b) by 533 days.

(21) Appl. No.: 14/164,133

(22) Filed: Jan. 24, 2014

Related U.S. Application Data

(60) Provisional application No. 61/756,389, filed on Jan. 24, 2013.

(51) Int. Cl.
*G01R 33/48* (2006.01)
(52) U.S. Cl.
CPC ................. *G01R 33/4828* (2013.01)
(58) Field of Classification Search
CPC .................................................. G01R 33/4828
See application file for complete search history.

(56) References Cited

U.S. PATENT DOCUMENTS

| | | | |
|---|---|---|---|
| 6,271,665 B1 | 8/2001 | Berr et al. | |
| 6,307,368 B1 | 10/2001 | Vasanawala et al. | |
| 6,922,054 B2 | 7/2005 | Hargreaves et al. | |
| 7,096,056 B2 | 8/2006 | Miller et al. | |
| 7,233,818 B1 * | 6/2007 | Aletras | G01R 33/56308 324/307 |
| 7,567,081 B2 | 7/2009 | Bieri et al. | |
| 8,067,936 B2 * | 11/2011 | Garwood | G01N 24/10 324/307 |
| 2004/0092809 A1 | 5/2004 | DeCharms | |
| 2004/0222794 A1 * | 11/2004 | Griswold | G01R 33/5611 324/309 |
| 2006/0253015 A1 * | 11/2006 | Nezafat | G01R 33/5635 600/410 |
| 2009/0143668 A1 * | 6/2009 | Harms | A61B 5/055 600/410 |

OTHER PUBLICATIONS

Scheffler and Hennig; Is TrueFISP a Gradient-Echo or a Spin Echo Sequence?; Magnetic Resonance in Medicine 49:395-397 (2003).
Scheffler et al; Detection of BOLD changes by means of a frequency-sensitive true FISP technique: preliminary results; NMR in Biomedicine 14:490-496 (2001).
Scheffler et al; Principles and applications of balanced SSFP techniques; Eur. Radiol. 13:2409-2418 (2003).
(Continued)

*Primary Examiner* — Rodney Bonnette
(74) *Attorney, Agent, or Firm* — David S. Alavi

(57) ABSTRACT

A modified steady-state free-precession (SSFP) method for functional magnetic resonance imaging (fMRI) is disclosed for acquiring a complex-valued image of object. A modulating field gradient is applied to impart spatial modulation of the steady-state signal phase and magnitude across the complex-valued image of the object along the direction of the modulating field gradient. SSFP pulse sequence parameters and modulating field gradient parameters can be selected to optimize functional image contrast between, e.g., oxy- and deoxy-hemoglobin, derived from steady-state signal magnitude or phase of complex-valued images.

24 Claims, 11 Drawing Sheets

(56) References Cited

OTHER PUBLICATIONS

Ogawa et al; Brain magnetic resonance imaging with contrast dependent on blood oxygenation; Proc. Natl. Acad. Sci. 87:9868-9872 (1990).
Ogawa et al; "Intrinsic signal changes accompanying sensory stimulation: Functional brain mapping with magnetic resonance imaging," Proc. Natl. Acad. Sci. 89:5951-5955 (1992.
Kwong et al; Dynamic magnetic resonance imaging of human brain activity during primary sensory stimulation; Proc. Natl. Acad. Sci. 89:5675-5679(1992).
Jongho Lee; Advanced fMRI Techniques: Steady-State Free Precession Techniques; 19th Annual Meeting & Exhibition, ISMRM, (2011).

\* cited by examiner

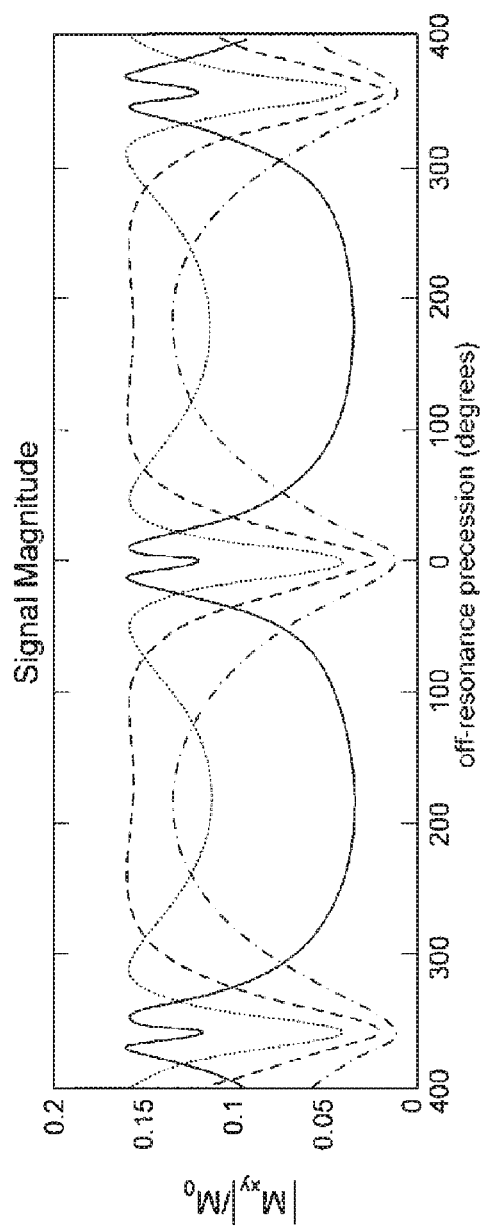
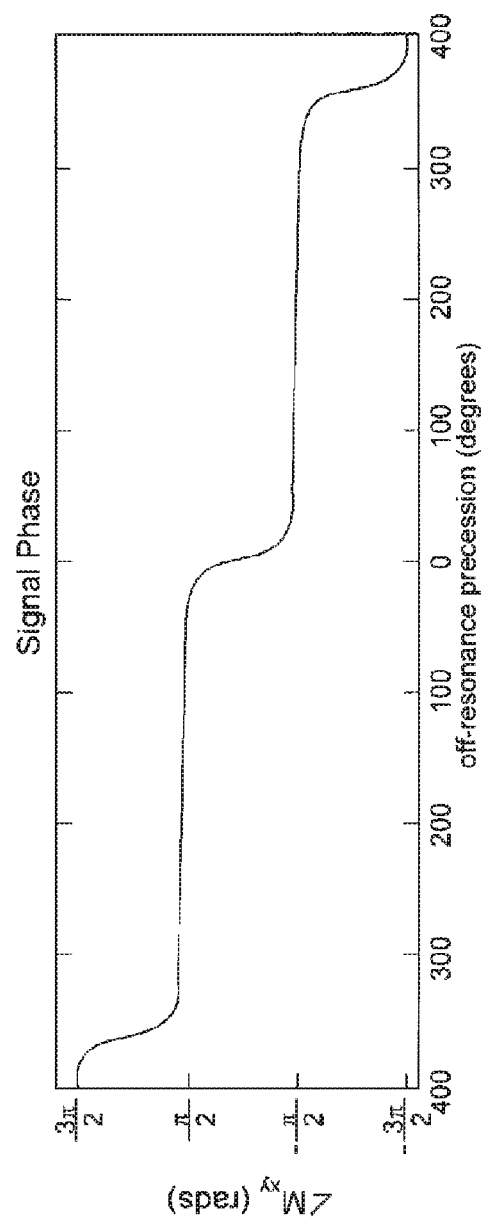
Fig. 1A (Prior Art)
Fig. 1B (Prior Art)

phase image magnitude image phase image magnitude image

FUNCTIONAL MAGNETIC RESONANCE IMAGING BY SPATIALLY MODULATING STEADY-STATE SIGNAL IN STEADY-STATE FREE PRECESSION

BENEFIT CLAIMS TO RELATED APPLICATIONS

This application claims benefit of U.S. provisional App. No. 61/756,389 filed Jan. 24, 2013 in the name of Abbas Nasiraei Moghaddam, said provisional application being hereby incorporated by reference as if fully set forth herein.

BACKGROUND

The field of the present invention relates to magnetic resonance imaging. In particular, methods are disclosed herein for functional magnetic resonance imaging.

A wide variety of techniques have been developed for magnetic resonance imaging (MRI); some are also suitable for so-called functional magnetic resonance imaging (fMRI). Some examples are disclosed in:

U.S. Pat. No. 6,271,665 entitled "Extra slice spin tagging (EST) magnetic resonance imaging for determining perfusion" issued Aug. 7, 2001 to Berr et al;

U.S. Pat. No. 6,307,368 entitled "Linear combination steady-state free precession MRI" issued Oct. 23, 2001 to Vasanawala et al;

U.S. Pub. No. 2004/0092809 entitled "Methods for measurement and analysis of brain activity" published May 13, 2004 to DeCharms;

U.S. Pat. No. 6,922,054 entitled "Steady state free precession magnetic resonance imaging using phase detection of material separation" issued Jul. 26, 2005 to Hargreaves et al;

U.S. Pat. No. 7,096,056 entitled "Functional magnetic resonance imaging using steady state free precession" issued Aug. 22, 2006 to Miller et al;

U.S. Pat. No. 7,567,081 entitled "Magnetic resonance non-balanced-SSFP method for the detection and imaging of susceptibility related magnetic field distortions" issued Jul. 28, 2009 to Bieri et al;

Scheffler and Hennig; Is TrueFISP a Gradient-Echo or a Spin-Echo Sequence?; Magnetic Resonance in Medicine 49:395-397 (2003);

Scheffler et al; Detection of BOLD changes by means of a frequency-sensitive true FISP technique: preliminary results; NMR in Biomedicine 14:490-496 (2001);

Scheffler et al; Principles and applications of balanced SSFP techniques; Eur. Radiol. 13:2409-2418 (2003);

Ogawa et al; Brain magnetic resonance imaging with contrast dependent on blood oxygenation; Proc. Natl. Acad. Sci. 87:9868-9872 (1990);

Ogawa et al; "Intrinsic signal changes accompanying sensory stimulation: Functional brain mapping with magnetic resonance imaging," Proc. Natl. Acad. Sci. 89:5951-5955 (1992);

Kwong et al; Dynamic magnetic resonance imaging of human brain activity during primary sensory stimulation; Proc. Natl. Acad. Sci. 89:5675-5679 (1992); and Jongho Lee; Advanced fMRI Techniques: Steady-State Free Precession Techniques; 19$^{th}$ Annual Meeting & Exhibition, ISMRM, (2011).

Functional MRI (fMRI) is a general term for MRI methods that are used for mapping the brain activity based on the blood flow (i.e., hemodynamic response) in different regions of the brain. BOLD (Blood Oxygenation Level Dependent) is the fundamental contrast mechanism of most fMRI techniques. BOLD generates functional contrast (between a resting state and an active state) based on the level of oxygenation in the blood perfusing a given region of brain tissue, which in turn slightly changes the magnetic susceptibility of that region of brain tissue. The generated functional contrast is typically quite small, so that typically repetitive scanning and statistical methods are needed to achieve an acceptable signal-to-noise ratio (SNR).

As noted by Miller et al (U.S. Pat. No. 7,096,056): "The dominant method for fMRI, Blood Oxygenation Level Dependent (BOLD) imaging is sensitive to changes in blood oxygenation that occur in response to brain activity. See, for example, Ogawa et al., 'Intrinsic Signal Changes Accompanying Sensory Stimulation: Functional Brain Mapping With Magnetic Resonance Imaging,' Proc Natl Acad Sci, USA, 89:5951 5955, 1992. The BOLD method is based on the sensitivity of the MR signal to deoxyhemoglobin, which has a resonance frequency that is shifted relative to water. BOLD fMRI uses Gradient Recalled Echo (GRE) imaging with a long echo time (TE) to increase the signal dephasing due to the deoxyhemoglobin frequency shift, resulting in signal levels that depend on the concentration of deoxyhemoglobin in the blood. While BOLD imaging represents a major advance in brain mapping, this method has a number of important limitations including poor spatial resolution, low signal levels, limited contrast and severe image artifacts. These limitations derive from the fact that BOLD contrast is coupled to sources of image degradation and signal loss."

Miller et al proceed to disclose "Functional magnetic resonance imaging using steady state free precession" (in U.S. Pat. No. 7,096,056). That method shall be referred to as "conventional BOSS" (Blood Oxygenation by Steady State). The conventional BOSS method takes advantage of the generally high sensitivity of steady-state free precession (SSFP) methods to shifts of resonance frequency. In conventional BOSS, the RF center frequency is adjusted to be between the respective resonance frequencies of oxy- and deoxy-hemoglobin to substantially increase the functional image contrast (between resting and active states of brain tissue) and signal-to-noise ratio by effectively "flipping the signs" of the respective steady-state signals relative to each other (due to a π phase shift across the resonance). An important disadvantage of the conventional BOSS method is the limited extent of the spatial region that can be imaged. That limitation is imposed by practical limitations on the magnetic field uniformity that can be achieved by shimming a real imaging system. In an imaging system with a well-shimmed magnet, inhomogeneities in the magnetic field will typically shift resonance frequencies on the order of 0.1-1.0 Hz per mm across an image. Because the resonance frequency shift between oxy-hemoglobin and deoxy-hemoglobin is only about 5-10 Hz (in a 1.5 or 3 T scanner), the functional image contrast can vary widely over only a few centimeters of the image based on whether the respective resonances have nearly the same phase (little or no contrast) or phases differing by about π (larger contrast). This represents a significant limitation on the utility of the conventional BOSS method, because it is suitable for mapping only relatively small areas of the brain (e.g., regions only a few centimeters wide, over which the RF central frequency lies between the respective resonance frequencies of oxy- and deoxy-hemoglobin). Miller et al suggest RF phase cycling (to increase the spatial extent of the effective mapping) as a solution, but that requires repeated image acquisitions. Such repeated acquisitions are time consuming and may not be suitable for functional imaging in which temporal evolution of the image is desired.

SUMMARY

A method comprises: (a) placing an object to be imaged in a substantially uniform magnetic field $B_0$; (b) applying a repeating sequence of RF and field-gradient pulses; (c) applying a non-zero modulating field gradient; (d) detecting and recording steady-state spin echo or gradient echo signals; and (e) extracting a complex-valued image of the object. The repeating pulse sequence comprises (i) one or more RF pulses, (ii) one or more slice-selection field-gradient pulses, (iii) one or more phase-encoding field-gradient pulses, and (iv) one or more readout field-gradient pulses. The repeating pulse sequence is applied with the object positioned in the magnetic field $B_0$. The steady-state spin echo or gradient echo signals are detected and recorded for multiple repetition cycles of the pulse sequence. Steady-state signal magnitude and steady-state signal phase for each voxel of a complex-valued image of the object are extracted from the recorded steady-state echo signals. The repetition time $T_R$ of the pulse sequence is less than the longitudinal relaxation time $T_1$ of the object. The modulating field gradient is applied to the object during at least a portion of each repetition cycle of the pulse sequence. The modulating field gradient imparts spatial modulation of the steady-state signal phase and magnitude across the complex-valued image of the object along the direction of the modulating field gradient. In some examples, the phase modulation can be monotonic (and in many instances quasi-linear) if "unwrapped", or can approximate a sawtooth function if the phase modulation is limited to only one period of signal profile (i.e., $\pm\pi$ phase shift).

Objects and advantages pertaining to functional magnetic resonance imaging may become apparent upon referring to the exemplary embodiments illustrated in the drawings and disclosed in the following written description or appended claims.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 1A and 1B are reproductions of FIGS. 2A and 2B, respectively, of U.S. Pat. No. 7,096,056 (Miller et al) illustrating variation of balanced SSFP signal magnitude and phase, respectively, as a function of detuning of the RF frequency from a resonance of a scanned object.

Figures 2A, 2C:
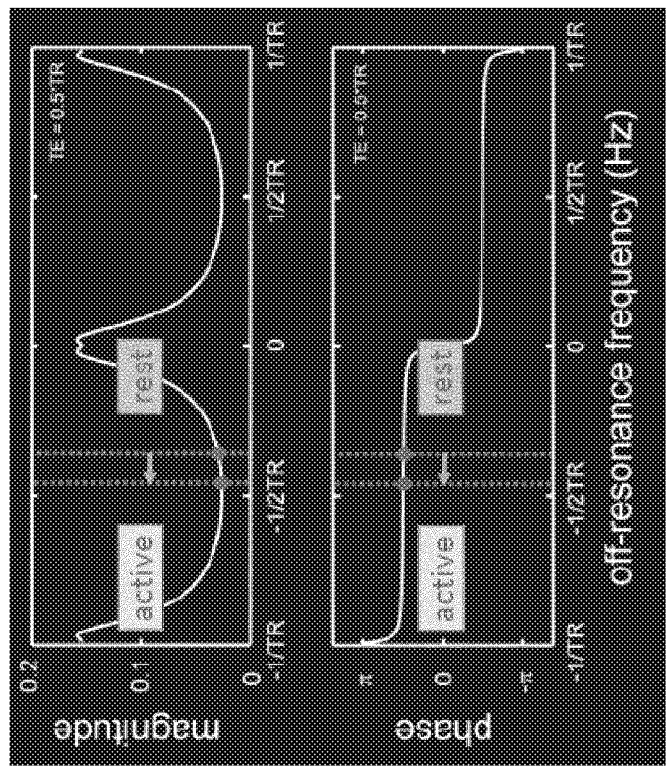
FIGS. 2A and 2B show the balanced SSFP signal shift arising from oxy- and deoxy-hemoglobin for an RF frequency between the resonances of oxy- and deoxy hemoglobin.
FIGS. 2C and 2D show the balanced SSFP signal shift arising from oxy- and deoxy-hemoglobin for an RF frequency that is offset from both the resonances of oxy- and deoxy hemoglobin. Jongho Lee; Advanced fMRI Techniques: Steady-State Free Precession Techniques; 19th Annual Meeting & Exhibition, ISMRM, (2011).

Each one of FIGS. 7-10 includes a measured amplitude or phase image and one or more corresponding measured time series of the steady-state signal phase in radians (and magnitude in FIG. 7) from alternating active and resting states of the corresponding indicated voxel.

It should be noted that the embodiments depicted in this disclosure are shown only schematically, and that not all features may be shown in full detail or in proper proportion. Certain features or structures may be exaggerated relative to others for clarity. It should be noted further that the embodiments shown are examples only, and should not be construed as limiting the scope of the written description or appended claims.

DETAILED DESCRIPTION OF EMBODIMENTS

For any magnetic resonance imaging (MRI) technique, an object to be imaged is placed in a strong, substantially uniform magnetic field, e.g., up to 10 T or even higher; magnetic field strength of 1.5 T and 3 T are common in commercially available scanners. Ideally, the magnetic field would be perfectly uniform; in reality, the "substantially uniform" magnetic field varies by, e.g., 10 to 50 ppm over a 30 to 50 cm diameter volume in a typical commercial scanner. "Shimming" the magnet refers to using small, additional magnets to compensate for spatial variations of the magnetic field strength of the main magnet, thereby reducing spatial variations in the total magnetic field. Most commonly, variations in the magnetic field are made as small as practicable or possible (i.e., optimal shimming) to obtain the highest quality images.

Steady-state free precession (SSFP) MRI is typically achieved using a repeating sequence of (i) one or more RF pulses (typically centered at an RF frequency chosen to correspond to a proton resonance in the object to be imaged) and (ii) one or more of each of slice-selection, phase-encoding, and readout field-gradient pulses; each of those field-gradient pulses imparts a transient, substantially linear variation of the magnetic field strength along a corresponding orthogonal axis. In a 2D imaging technique, the RF pulse and slice-selection field-gradient pulse tilt through a flip angle $\alpha$ the magnetization vector of the object within a two-dimensional slice of the object; in a 3D imaging technique, slice selection may be relaxed or omitted, and the RF pulse flip the magnetization of a volume of the object. The phase-encoding and readout field-gradient pulses impart a position-dependent perturbation of the precession of that tilted magnetization. Often the amplitude of the phase-encoding field-gradient pulse is varied from one pulse sequence to the next; the amplitude might be zero for one or more pulse sequences, but typically is non-zero for at least some of the pulse sequences; the slice-selection and readout field-gradient pulses typically are non-zero and substantially constant among the multiple repeating pulse sequences. Steady-state spin echo or gradient echo signals are detected and recorded for multiple repetitions of the pulse sequence, which repeats with a repetition time $T_R$ that is significantly smaller than the $T_1$ relaxation time of the tilted magnetization. In so-called balanced SSFP, each type of field-gradient pulse (i.e., slice-selection, phase-encoding, and readout) has equal and opposite positive and negative portions, so that each gradient pulse is compensated and the overall magnetization consists of a single magnetization vector that is not spatially dephased (Scheffler et al, Eur. Radiol. 2003).

Figures 2B, 2D:
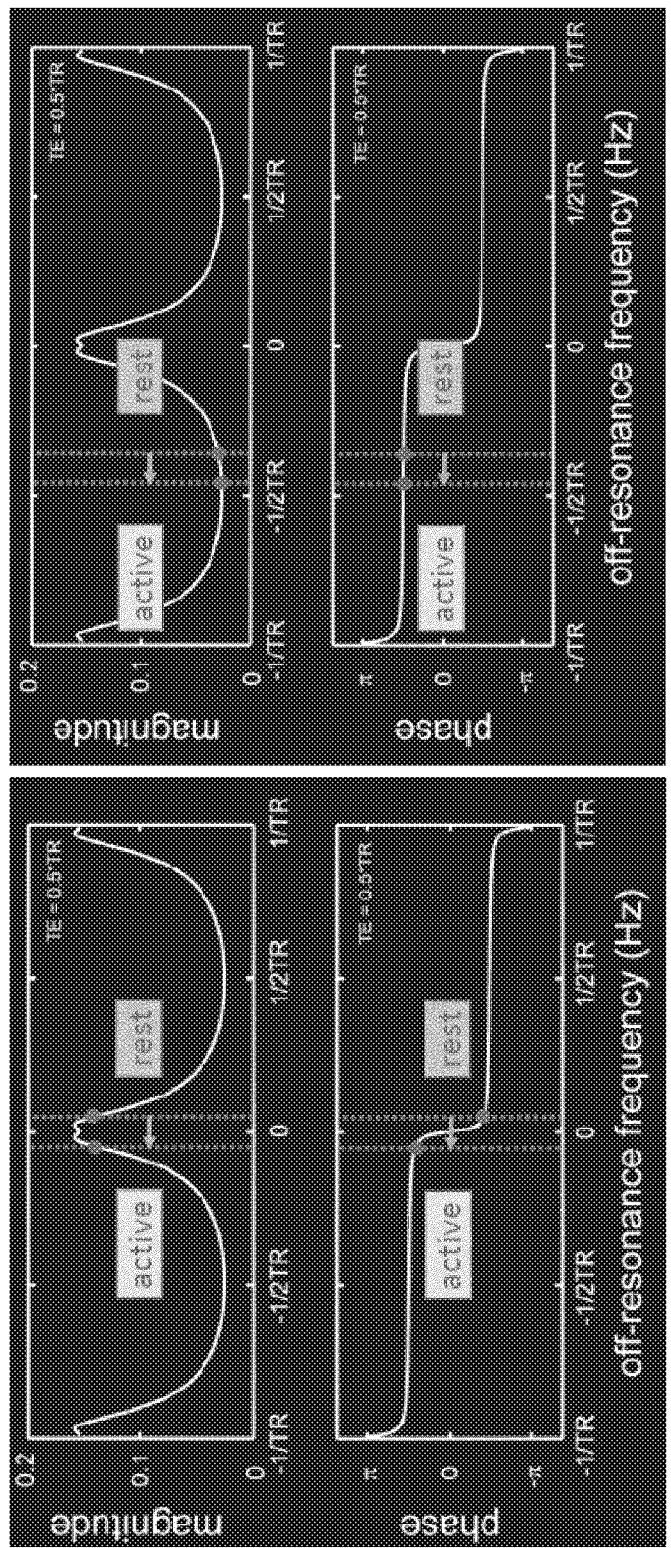

FIGS. 1A and 1B are reproductions of FIGS. 2A and 2B of U.S. Pat. No. 7,096,056 (Miller et al), which illustrate magnitude and phase, respectively, of complex-valued on- and off-resonance signals acquired using balanced SSFP MRI for different flip angles imparted by the RF pulse (solid line: $\alpha=5°$; dotted line: $\alpha=15°$; dashed line: $\alpha=30°$; dashed/dotted line: $\alpha=60°$). Note that for some tilt angles (e.g., $\alpha=5°$), the signal magnitude is maximum near resonance and minimum off resonance, and that for other tilt angles (e.g., $\alpha=60°$) the reverse is true. For certain tilt angles (e.g., $\alpha=30°$), the off-resonance signal magnitude is nearly constant. For all tilt angles, the off-resonance phase is nearly constant while near resonance the phase changes abruptly by $\pi$.

In the conventional BOSS fMRI method of Miller et al, the center frequency of the RF pulse is set between the respective resonances of oxy- and deoxy-hemoglobin (which are typically separated by only 5-10 Hz in a 1.5 T or 3 T scanner). Changes in oxygenation result in a change of sign (i.e., a $\pi$ phase shift) of the signal arising from hemoglobin that has changed oxygenation state (as in FIGS. 2A and 2B), in turn enabling functional imaging of, e.g., a region of the brain. However, even in a well-shimmed scanner, inhomogeneities in the magnetic field will shift the hemoglobin resonances on the order of 0.1-1.0 Hz per mm across the image. As a result, in another region of the brain, a change of hemoglobin oxygenation state results in little or no phase shift, and the functional contrast is significantly reduced or even effectively eliminated (as in FIGS. 2C and 2D).

The presently disclosed methods (i.e., modified BOSS) address that spatial limitation of the conventional BOSS method. An example of such a method comprises: (a) placing an object to be imaged in a substantially uniform non-zero magnetic field $B_0$; (b) applying a repeating sequence of RF and field-gradient pulses; (c) applying a non-zero modulating field gradient; (d) detecting and recording steady-state spin echo or gradient echo signals; and (e) extracting a complex-valued image of the object. The repeating pulse sequence comprises (i) one or more RF pulses, (ii) one or more non-zero slice-selection field-gradient pulses, (iii) one or more phase-encoding field-gradient pulses, and (iv) one or more non-zero readout field-gradient pulses. The repeating pulse sequence is applied with the object positioned in the magnetic field $B_0$. The steady-state spin echo or gradient echo signals are detected and recorded for multiple repetition cycles of the pulse sequence. Steady-state signal magnitude (equivalently, amplitude) and steady-state signal phase for each voxel of a complex-valued image of the object are extracted from the recorded steady-state echo signals. The repetition time $T_R$ of the pulse sequence is significantly less than the longitudinal relaxation time $T_1$ of the object. The modulating field gradient is applied to the object during at least a portion of each repetition cycle of the pulse sequence.

Figure 3:
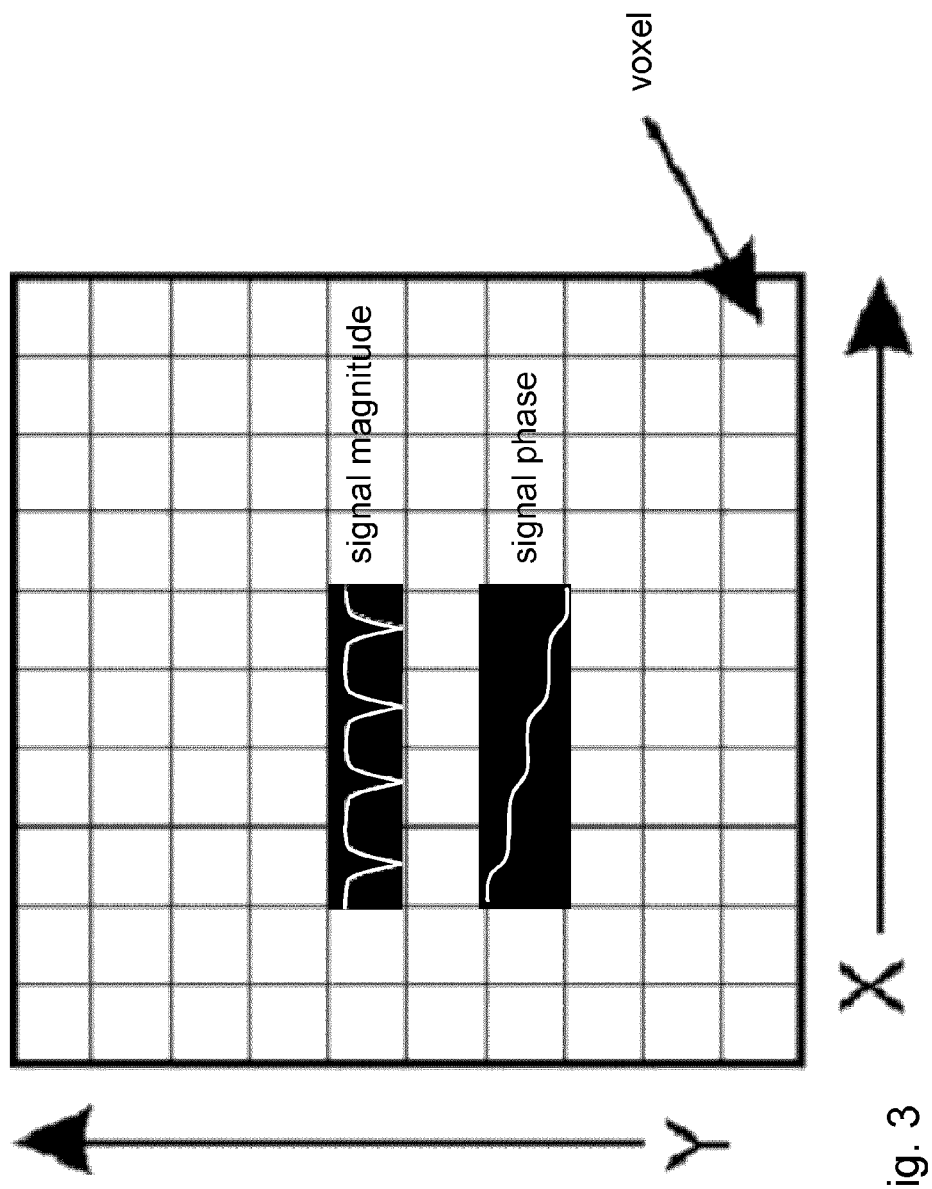
FIG. 3 illustrates schematically the spatial variation of SSFP signal magnitude and phase superimposed on the voxels of a magnetic resonance image.

Except for applying the modulating field gradient, the sequence given above resembles any of a variety of conventional SSFP MRI methods. However, the addition of the modulating field gradient distinguishes the presently disclosed methods ("modified BOSS") from conventional SSFP methods (including the conventional BOSS method). FIG. 3 illustrates one example of spatial variation of the steady state signal magnitude and phase superimposed on the voxels of a magnetic resonance image when the modulating field gradient is applied. That modulating field gradient imparts spatial modulation of the steady-state signal phase and magnitude across the complex-valued image of the object along the direction of the modulating field gradient. The phase modulation (i) can be monotonic, (ii) can approximate a sawtooth function (typically varying between $\pm\pi$), (iii) can be quasi-linear. "Quasi-linear" indicates modulation of the steady-state signal phase ranging from a "staircase" type phase variation (e.g., as in FIG. 3) to a more nearly linear variation (perhaps with undulations) that occurs as the width between regions producing on-resonance signals decreases and the "staircase" begins to distort and smooth out.

In the conventional BOSS method of Miller et al, some voxels exhibit significant functional image contrast where the RF center frequency lies between the respective resonance frequencies of oxy- and deoxy-hemoglobin (as in FIGS. 2A and 2B), while other voxels exhibit little or no functional contrast where the oxy- and deoxy-hemoglobin resonance frequencies are shifted to the same side of the RF center frequency (as in FIGS. 2C and 2D). As a result, the functional contrast between oxy- and deoxy-hemoglobin varies considerably with position across the image, limiting the size of a brain region over which the conventional BOSS method can be used. In the presently disclosed, modified BOSS methods, the modulating field gradient, and the spatial modulation of the steady-state signal phase and magnitude imparted by the modulating field gradient, results in consistent functional image contrast among the voxels of the entire image arising from, e.g., changes in the oxygenation state of hemoglobin. The maximum achievable functional contrast in the presently disclosed modified BOSS method is somewhat less than the maximum functional contrast achievable using conventional BOSS, however, the functional contrast of the modified BOSS method is more consistently exhibited over a larger area of the images object (e.g., a patient's brain). In addition, the usual need for extremely careful shimming of the of the magnetic field $B_0$ is eliminated; in the modified BOSS technique, the application of the additional, modulating field gradient renders moot any need to precisely shim the magnet.

Figure 4A:
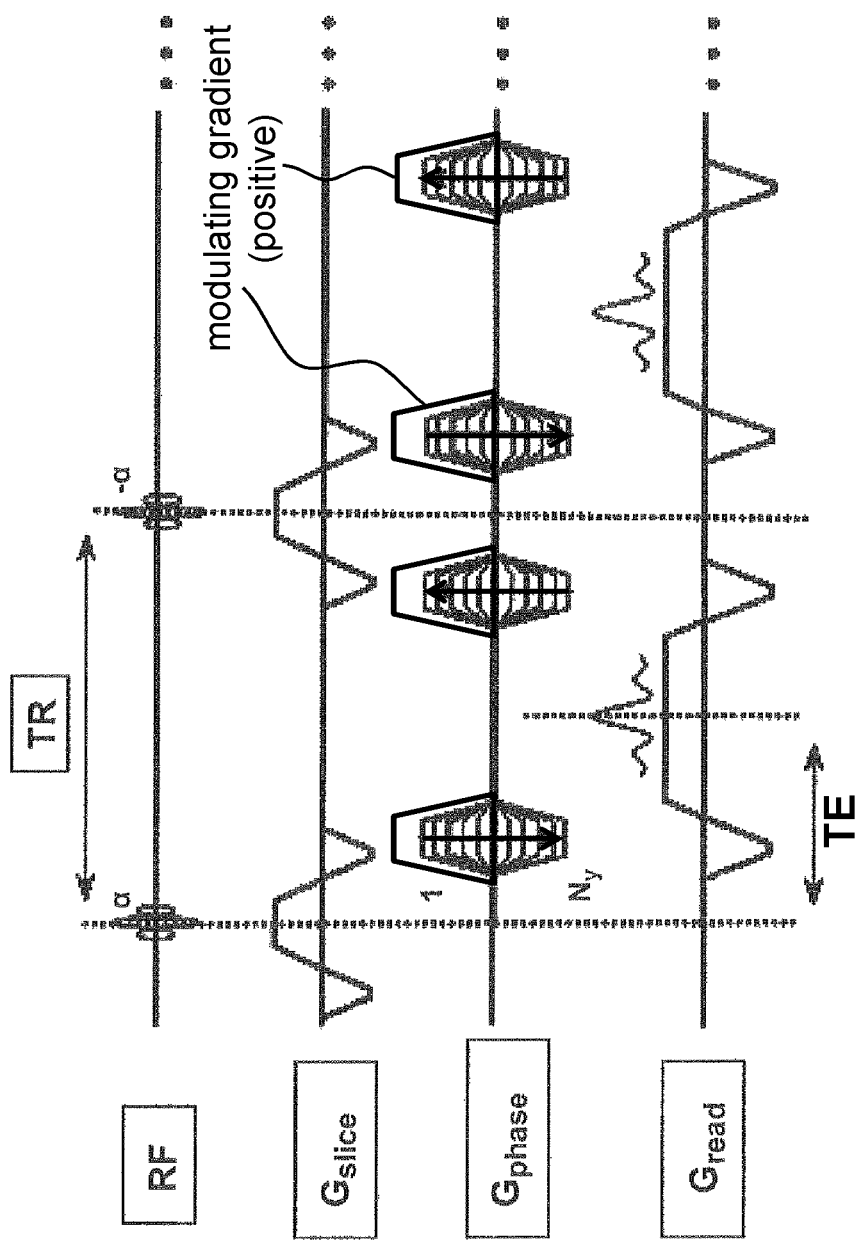
FIGS. 4A and 4B illustrate schematically examples of a suitable pulse sequence and a suitable modulating field gradient.
Figure 4B:
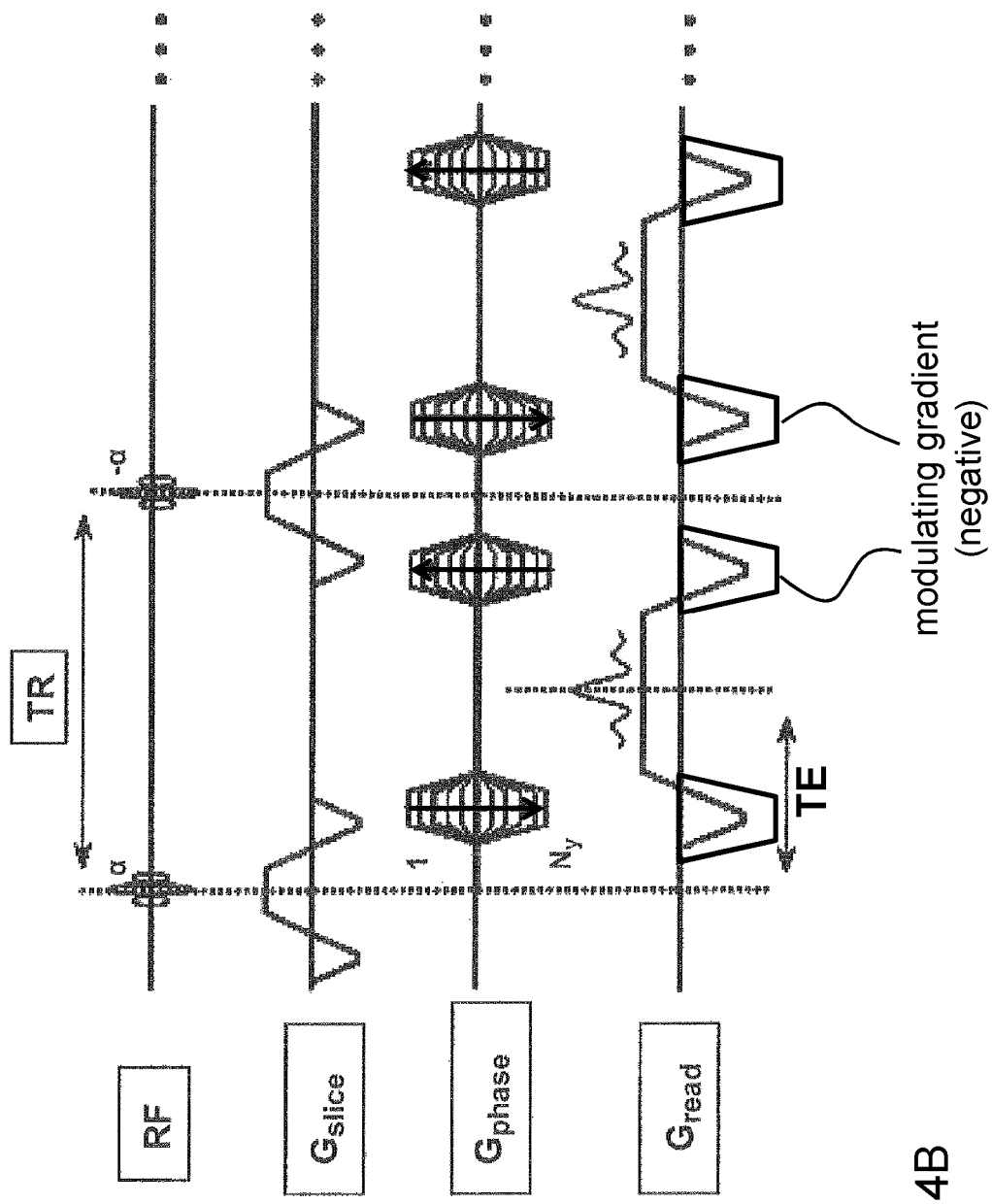

Any suitable SSFP sequence can be employed in the modified BOSS method; in one preferred example, the repeating pulse sequence comprises a balanced SSFP pulse sequence. In most examples of conventional SSFP, $T_R$ is only a few milliseconds, e.g., 3-5 ms, and that generally smaller $T_R$ is considered desirable for decreasing image acquisition time. Note however that increasing $T_R$ also advantageously decreases the distance between spatial regions of on-resonance signals. Therefore it can be advantageous to increase $T_R$ to 5 ms, 8 ms, 10 ms, or even longer (e.g., 15 ms or 20 ms). The separation between regions of on-resonance signal also decreases with increasing magnitude of the modulating field gradient. In one example a positive modulating field gradient of about 10 mT/m is applied along the direction of the phase-encoding field-gradient pulse during and in addition to application of the phase-encoding field-gradient pulses in two 0.5 ms periods (as in FIG. 4A); in another example a negative modulating field gradient of about 10 mT/m is applied along the direction of the readout field-gradient pulse during and in addition to the negative lobes of the readout field-gradient pulse (as in FIG. 4B); other combinations of magnitude, direction, and timing of the modulating field gradient can be employed. In some combinations, the non-zero modulating field gradient can be present during the entire duration of each repetition cycle of the pulse sequence; in other combinations, the non-zero modulating field gradient is present during only one or more portions of each repetition cycle and absent (i.e., zero) during one or more remaining portions of each repetition cycle. More examples of suitable combinations of magnitude, direction, and timing of the modulating field gradient are given below.

As shown in FIGS. 1A and 1B, the frequency-dependent behavior of the steady-state signal magnitude and phase depends strongly on the flip angle α imparted by the RF pulse. In some examples, it may be desirable to select a flip angle α that results in a maximum or near-maximum ratio of off-resonance signal amplitude to on-resonance signal amplitude, e.g., similar to the dashed curve of FIG. 1A; in some other examples, it may be desirable to select a flip angle α that maximizes functional image contrast between active and resting images or the image contrast arising from differences between magnetic resonance frequencies of oxy- and deoxy-hemoglobin. Other flip angles α can be employed to achieve desired steady-state signal behavior or desired image contrast.

As already noted, the modified BOSS method disclosed herein can be advantageously employed for functional magnetic resonance imaging (fMRI), e.g., to localize brain activity arising from certain actions or stimuli. Functional contrast arises from differing resonance frequencies of oxy- versus deoxy-hemoglobin; it has been noted elsewhere that increased brain activity is spatially and temporally correlated with increased oxy-hemoglobin and concomitantly decreased deoxy-hemoglobin. A method for fMRI therefore can comprise: (i) with the patient's brain in a resting state, applying the repeating pulse sequence and the modulating field gradient, detecting and recording the steady-state echo signals, and extracting the steady-state signal magnitude or the steady-state signal phase for each voxel of a complex-valued resting image of the patient's brain; (ii) with the patient's brain in an active state, applying the repeating pulse sequence and the modulating field gradient, detecting and recording the steady-state echo signals, and extracting the steady-state signal magnitude or the steady-state signal phase for each voxel of a complex-valued active image of the patient's brain; and (iii) forming a functional image of the patient's brain by calculating corresponding differences of respective phases, amplitudes, real parts, or imaginary parts between the complex-valued active and resting images. "Active" means that the patient is performing an assigned task or movement or is subject to a designed stimulus; "resting" means that the patient is at rest and is not performing any assigned task or movement or is not subject to any designed stimulus.

As noted above, the modified BOSS technique can be employed for functional imaging wherein the image is greater than about 10 cm wide along the direction of the modulating field gradient, or even larger. The extent of functional imaging typically is extended in a direction orthogonal to the modulating field gradient to a similar extent. In some examples an adequate functional image of the patient's entire brain can be acquired. In some examples a single functional image might be adequate; in other instances the preceding steps can be repeated and the resulting functional images averaged. The functional image can be formed by calculating corresponding differences of respective phases, amplitudes, real parts, or imaginary parts between the complex-valued active and resting images. However, given the spatial modulation of the steady-state signal phase and magnitude imparted by the modulating field gradient, a functional image formed by calculating the phase differences between the complex-valued active and resting images can be successfully employed in many instances. To exploit this, it may be desirable to select a repetition time $T_R$ and magnitude and direction of the modulating field gradient so that applying the modulating field gradient results in the phase variation being a quasi-linear phase variation along the direction of the modulating field gradient that is: greater than about $\pi/2$ radians per voxel; greater than about $2\pi/3$ radians per voxel; greater than about $3\pi/4$ radians per voxel; about $\pi$ radians per voxel; less than about $5\pi/4$ radians per voxel; or less than about $4\pi/3$ radians per voxel; or less than about $3\pi/2$ radians per voxel.

Figure 5:
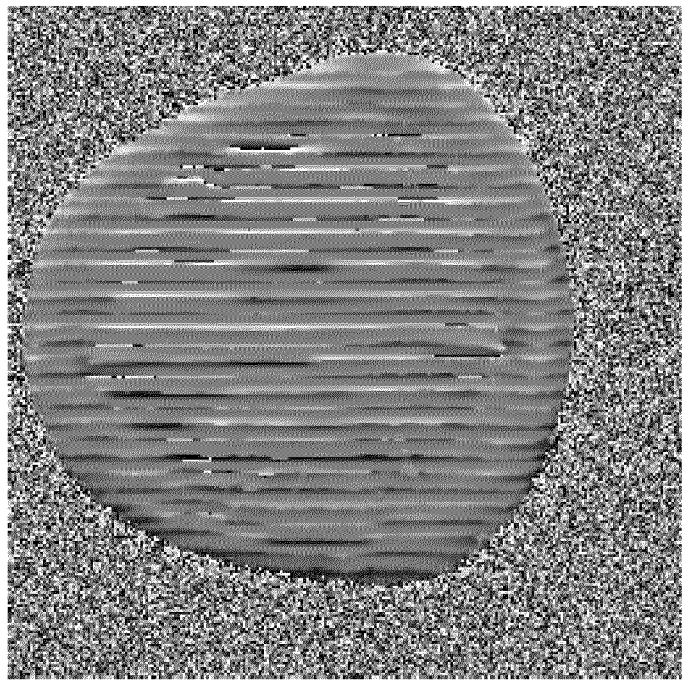
FIGS. 5 and 6 are examples of corresponding pairs of measured amplitude and phase images acquired using the modified BOSS method.
Figure 5:
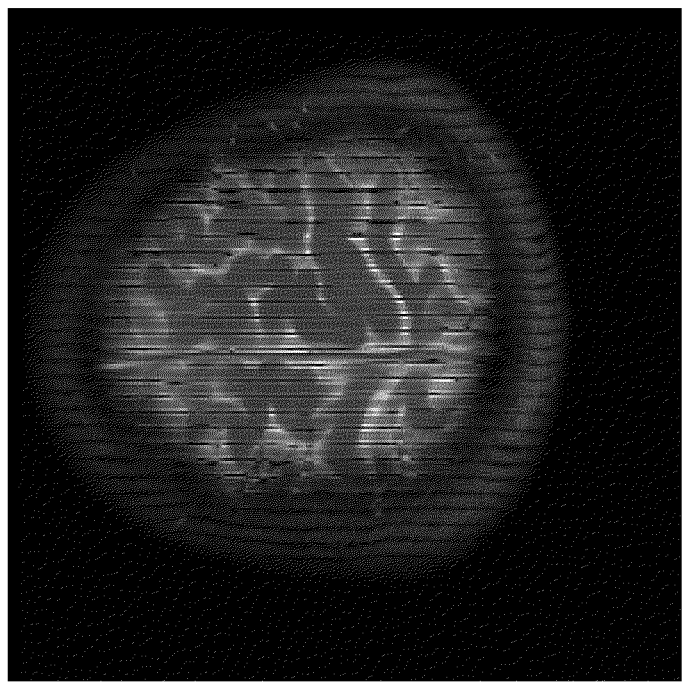
Figure 6:
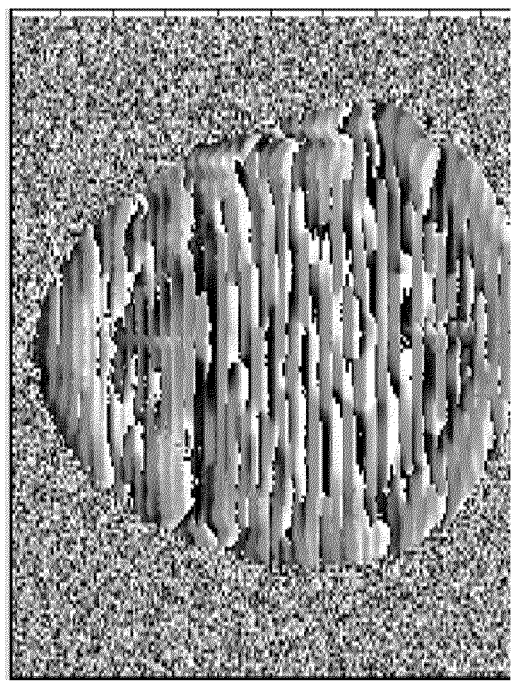
Figure 6:
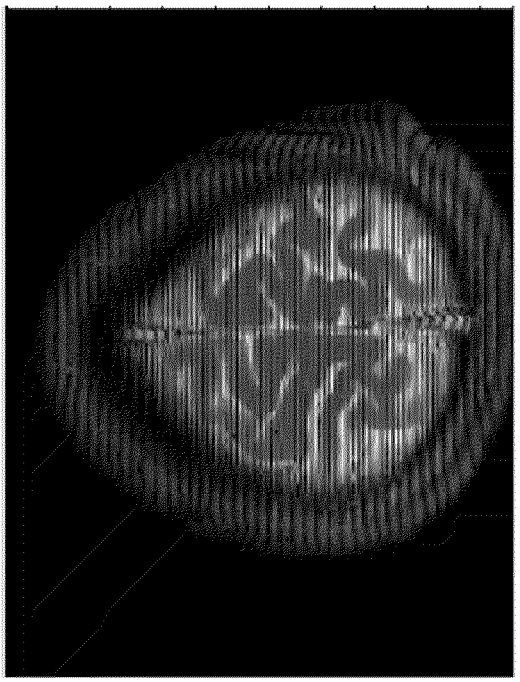
Figure 7:
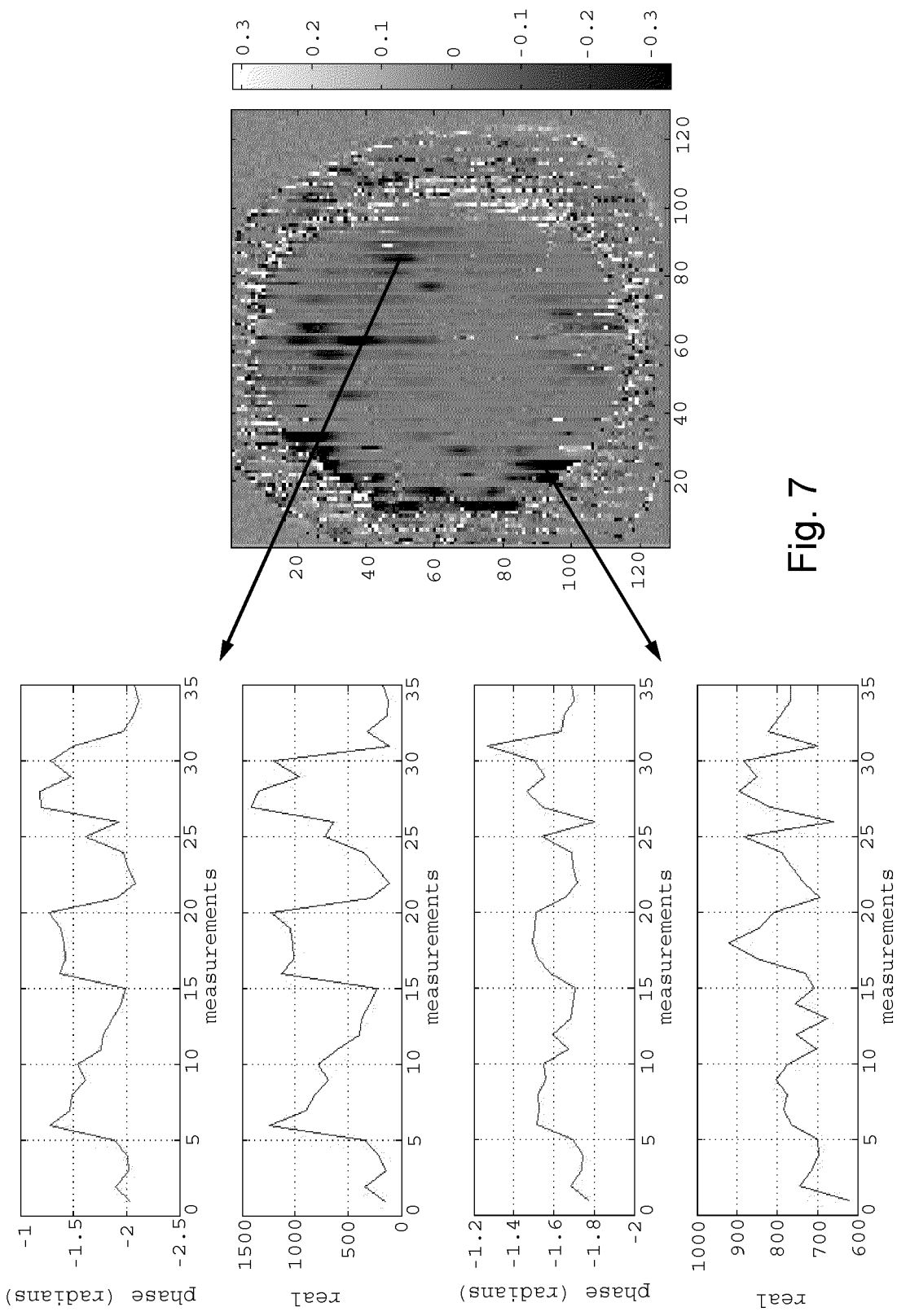
Figure 8:
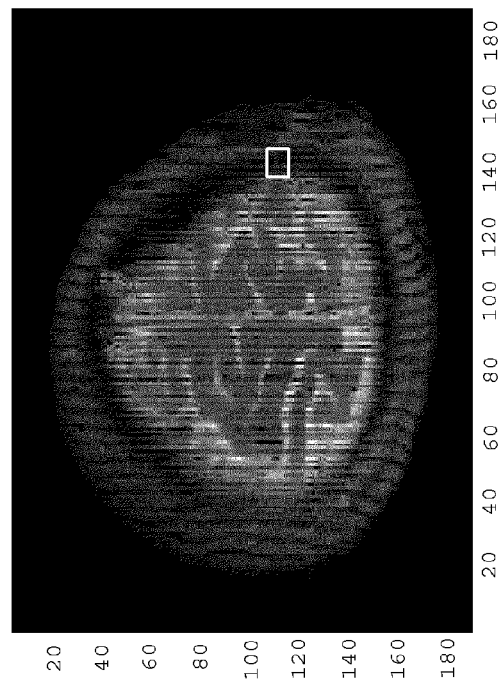
Figure 8:
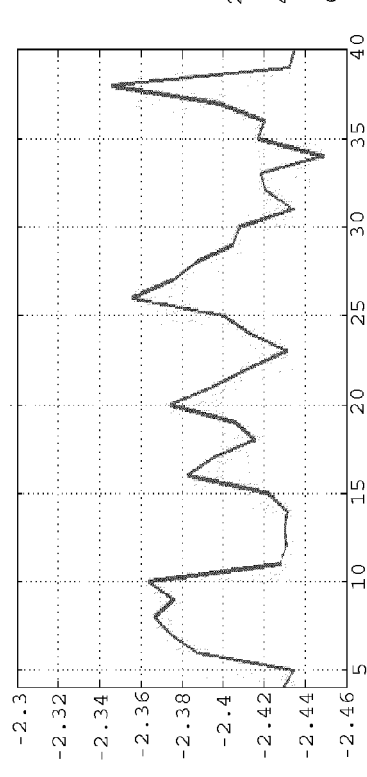
Figure 8:
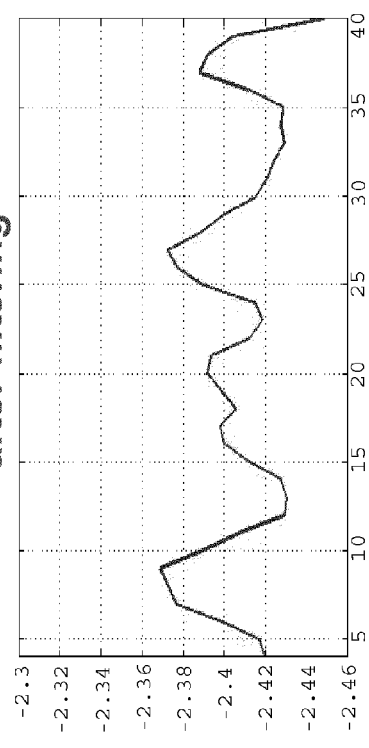
Figure 9:
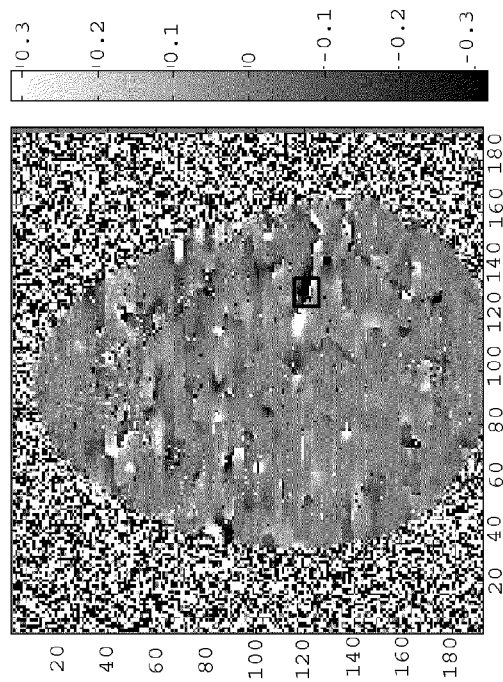
Figure 9:
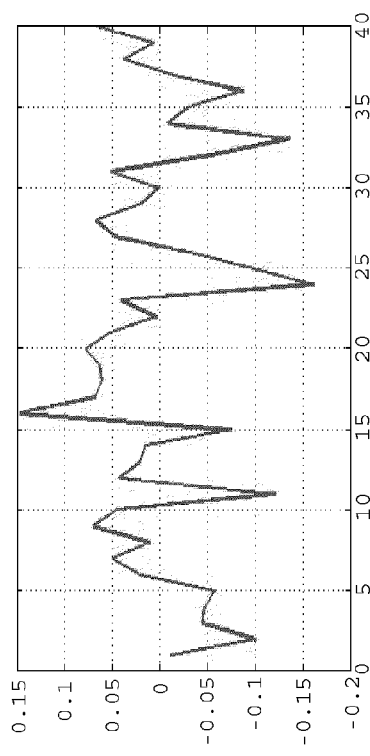
Figure 9:
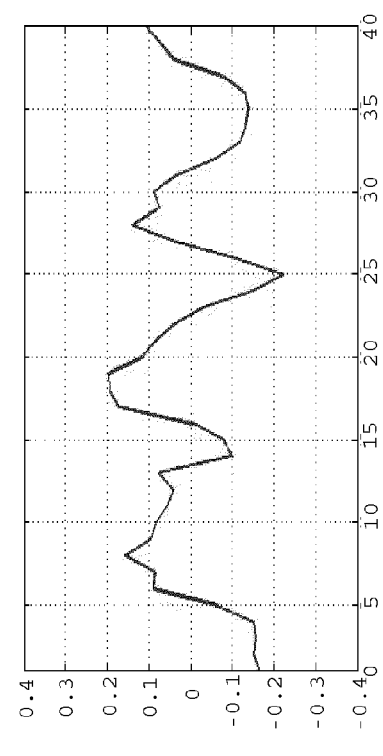
Figure 10:
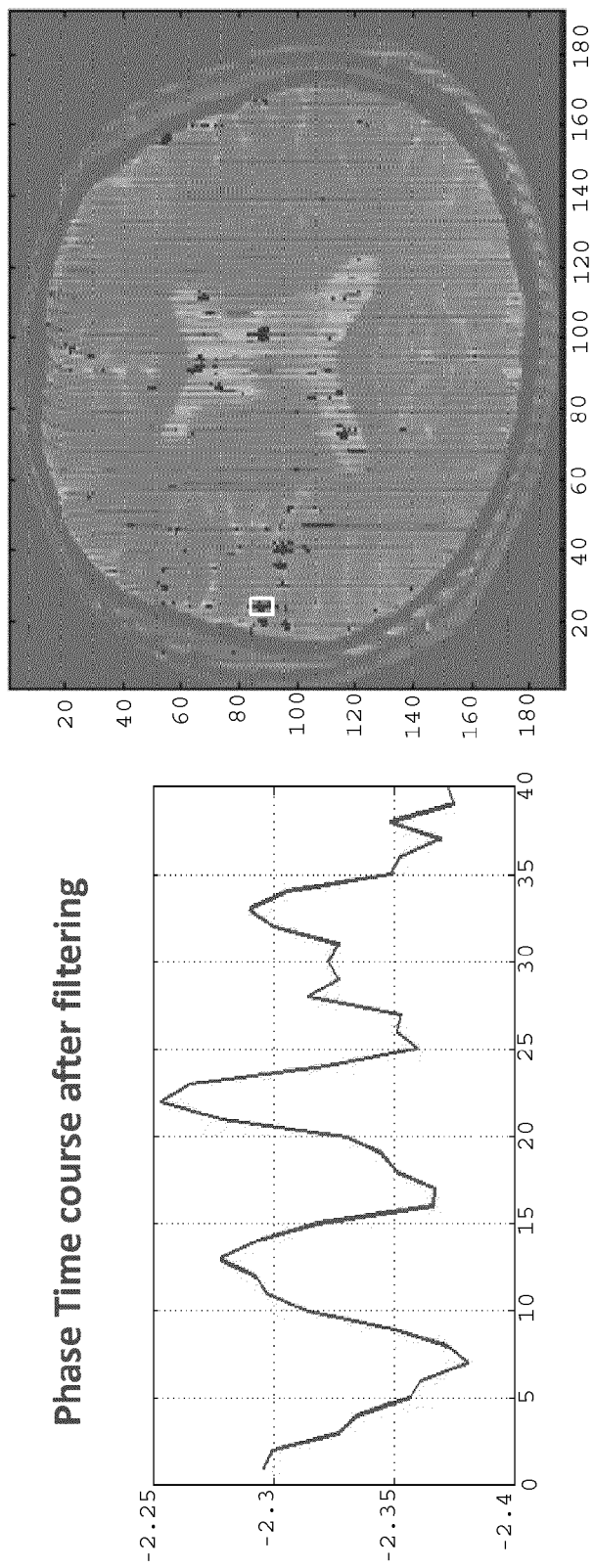

Actual functional images of a human brain are shown in FIGS. 5 through 11. In each example a scanner with a field strength of 3 T was employed in a balanced SSFP arrangement with a flip angle of α=24° and $T_R$=5-10 ms. The modulating field gradient was applied along the direction of the readout field-gradient pulse. Examples of typical pairs of amplitude and phase images are shown in FIGS. 5 and 6. Each of FIGS. 7-10 includes an amplitude or phase image of a patient's brain and one or more corresponding time series (alternating resting and active states of a finger-tapping activity) of the steady-state signal phase (in radians; and also signal magnitude in FIG. 7) from a specific voxel indicated in the corresponding image. None of those examples has been optimized; they constitute proof-of-principle measurements that indicate the viability of the disclosed modified BOSS method for functional magnetic resonance imaging.

In addition to the preceding, the following examples fall within the scope of the present disclosure or appended claims:

Example 1

A method comprising: (a) placing an object to be imaged in a substantially uniform non-zero magnetic field $B_0$; (b) with the object positioned in the magnetic field $B_0$, applying to the object a repeating sequence of (i) one or more RF pulses, (ii) one or more non-zero slice-selection field-gradient pulses, (iii) one or more phase-encoding field-gradient pulses, and (iv) one or more non-zero readout field-gradient pulses; (c) during at least a portion of each repetition cycle of the pulse sequence, applying to the object a non-zero modulating field gradient; (d) detecting and recording steady-state spin echo or gradient echo signals for multiple repetition cycles of the pulse sequence; and (e) extracting from the recorded steady-state echo signals a steady-state signal magnitude or a steady-state signal phase for each voxel of a complex-valued image of the object, wherein: (f) repetition time $T_R$ of the pulse sequence is less than the longitudinal relaxation time $T_1$ of the object; and (g) the modulating field gradient imparts spatial modulation of the steady-state signal phase and magnitude across the complex-valued image of the object along the direction of the modulating field gradient.

Example 2

The Example 1 wherein the pulse sequence comprises a balanced SSFP pulse sequence.

Example 3

The method of Example 1 or 2 wherein the object is a patient's brain, the method further comprising: (i) with the patient's brain in a resting state, applying the repeating pulse sequence and the modulating field gradient, detecting and recording the steady-state echo signals, and extracting the steady-state signal magnitude or the steady-state signal phase for each voxel of a complex-valued resting image of the patient's brain; (ii) with the patient's brain in an active state, applying the repeating pulse sequence and the modulating field gradient, detecting and recording the steady-state echo signals, and extracting the steady-state signal magnitude or the steady-state signal phase for each voxel of a complex-valued active image of the patient's brain; and (iii) forming a functional image of the patient's brain by calculating corresponding differences of respective phases, amplitudes, real parts, imaginary parts, or a combination thereof between the complex-valued active and resting images.

Example 4

The method of Example 3 wherein an area of functional image contrast within the image is greater than about 10 cm wide along the direction of the modulating field gradient.

Example 5

The method of Example 3 further comprising repeating steps (i), (ii), and (iii), and averaging the resulting functional images.

Example 6

The method of Example 3 wherein the repetition time $T_R$ and magnitude and direction of the modulating field gradient are selected so as to maximize image contrast between the active and resting images.

Example 7

The method of Example 3 wherein image contrast between the active and resting images arises from differences between magnetic resonance frequencies of oxy- and deoxy-hemoglobin.

Example 8

The method of Example 3 wherein forming the functional image of the patient's brain comprises calculating corresponding differences of respective phases between the complex-valued active and resting images.

Example 9

The method of Example 3 wherein forming the functional image of the patient's brain comprises calculating corresponding differences of respective magnitudes between the complex-valued active and resting images.

Example 10

The method of any one of Examples 1-9 wherein a flip angle induced by the one or more RF pulses results in a maximum ratio of off-resonance signal amplitude to on-resonance signal amplitude.

Example 11

The method of any one of Examples 1-10 wherein the phase modulation is monotonic.

Example 12

The method of any one of Examples 1-10 wherein the phase modulation approximates a sawtooth function.

Example 13

The method of any one of Examples 1-10 wherein the phase modulation is quasi-linear.

Example 14

The method of any one of Examples 1-13 wherein the repetition time $T_R$ and magnitude and direction of the modulating field gradient are selected so that applying the modulating field gradient results in the phase modulation varying between about $\pi/2$ radians per voxel and about $3\pi/2$ per voxel radians along the direction of the modulating field gradient.

Example 15

The method of any one of Examples 1-14 wherein the repetition time $T_R$ and magnitude and direction of the modulating field gradient are selected so that applying the modulating field gradient results in the phase modulation varying between about $2\pi/3$ radians per voxel and about $4\pi/3$ per voxel radians along the direction of the modulating field gradient.

Example 16

The method of any one of Examples 1-15 wherein the repetition time $T_R$ and magnitude and direction of the modulating field gradient are selected so that applying the modulating field gradient results in the phase modulation varying between about $3\pi/4$ radians per voxel and about $5\pi/4$ radians per voxel along the direction of the modulating field gradient.

Example 17

The method of any one of Examples 1-16 wherein the repetition time $T_R$ and magnitude and direction of the modulating field gradient are selected so that applying the modulating field gradient results in the phase modulation varying by about $\pi$ radians per voxel along the direction of the modulating field gradient.

Example 18

The method of any one of Examples 1-17 wherein the modulating field gradient is applied along the same direction as the one or more phase-encoding field-gradient pulses.

Example 19

The method of any one of Examples 1-18 wherein the modulating field gradient is applied along the same direction as the one or more readout field-gradient pulses.

Example 20

The method of any one of Examples 1-19 wherein the modulating field gradient is applied along the same direction as the one or more slice-selection field-gradient pulses.

Example 21

The method of any one of Examples 1-20 wherein the modulating field gradient is applied during an entire duration of each repetition cycle of the pulse sequence.

Example 22

The method of any one of Examples 1-20 wherein the modulating field gradient is applied during one or more portions of each repetition cycle of the pulse sequence and is absent from one or more remaining portions of each repetition cycle of the pulse sequence.

Example 23

The method of Example 22 wherein the modulating field gradient is applied during one or more of the one or more phase-encoding field-gradient pulses.

Example 24

The method of Example 22 wherein the modulating field gradient is applied during one or more of the one or more readout field-gradient pulses.

It is intended that equivalents of the disclosed exemplary embodiments and methods shall fall within the scope of the present disclosure or appended claims. It is intended that the disclosed exemplary embodiments and methods, and equivalents thereof, may be modified while remaining within the scope of the present disclosure or appended claims.

In the foregoing Detailed Description, various features may be grouped together in several exemplary embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed exemplary embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., sets of features that are not incompatible or mutually exclusive) that appear in the present disclosure or the appended claims, including those sets that may not be explicitly disclosed herein. It should be further noted that the scope of the appended claims do not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure or appended claims, the words "comprising," "including," "having," and variants thereof, wherever they appear, shall be construed as open ended terminology, with the same meaning as if the phrase "at least" were appended after each instance thereof.

In the appended claims, if the provisions of 35 USC §112 ¶6 are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112 ¶6 are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A method comprising:
   (a) placing an object to be imaged in a substantially uniform non-zero magnetic field $B_0$;
   (b) with the object positioned in the magnetic field $B_0$, applying to the object a repeating sequence of (i) one or more RF pulses, (ii) one or more non-zero slice-selection field-gradient pulses, (iii) one or more phase-encoding field-gradient pulses, and (iv) one or more non-zero readout field-gradient pulses;
   (c) during at least a portion of each repetition cycle of the pulse sequence, applying to the object a non-zero modulating field gradient;
   (d) detecting and recording steady-state spin echo or gradient echo signals for multiple repetition cycles of the pulse sequence; and
   (e) extracting from the recorded steady-state echo signals a steady-state signal magnitude or a steady-state signal phase for each voxel of a complex-valued image of the object,
   wherein:
   (f) repetition time $T_R$ of the pulse sequence is less than the longitudinal relaxation time $T_1$ of the object; and
   (g) the modulating field gradient imparts spatial modulation of the steady-state signal phase and magnitude across the complex-valued image of the object along the direction of the modulating field gradient.

2. The method of claim 1 wherein the pulse sequence comprises a balanced SSFP pulse sequence.

3. The method of claim 1 wherein the object is a patient's brain, the method further comprising:
   (i) with the patient's brain in a resting state, applying the repeating pulse sequence and the modulating field gradient, detecting and recording the steady-state echo signals, and extracting the steady-state signal magnitude or the steady-state signal phase for each voxel of a complex-valued resting image of the patient's brain;
   (ii) with the patient's brain in an active state, applying the repeating pulse sequence and the modulating field gradient, detecting and recording the steady-state echo signals, and extracting the steady-state signal magnitude or the steady-state signal phase for each voxel of a complex-valued active image of the patient's brain; and (iii) forming a functional image of the patient's brain by calculating corresponding differences of respective phases, amplitudes, real parts, imaginary parts, or a combination thereof between the complex-valued active and resting images.

4. The method of claim 3 wherein an area of functional image contrast within the image is greater than about 10 cm wide along the direction of the modulating field gradient.

5. The method of claim 3 further comprising repeating steps (i), (ii), and (iii), and averaging the resulting functional images.

6. The method of claim 3 wherein the repetition time $T_R$ and magnitude and direction of the modulating field gradient are selected so as to maximize image contrast between the active and resting images.

7. The method of claim 3 wherein image contrast between the active and resting images arises from differences between magnetic resonance frequencies of oxy- and deoxy-hemoglobin.

8. The method of claim 3 wherein forming the functional image of the patient's brain comprises calculating corresponding differences of respective phases between the complex-valued active and resting images.

9. The method of claim 3 wherein forming the functional image of the patient's brain comprises calculating corresponding differences of respective magnitudes between the complex-valued active and resting images.

10. The method of claim 1 wherein a flip angle induced by the one or more RF pulses results in a maximum ratio of off-resonance signal amplitude to on-resonance signal amplitude.

11. The method of claim 1 wherein the phase modulation is monotonic.

12. The method of claim 1 wherein the phase modulation approximates a sawtooth function.

13. The method of claim 1 wherein the phase modulation is quasi-linear.

14. The method of claim 1 wherein the repetition time $T_R$ and magnitude and direction of the modulating field gradient are selected so that applying the modulating field gradient results in the phase modulation varying between about $\pi/2$ radians per voxel and about $3\pi/2$ per voxel radians along the direction of the modulating field gradient.

15. The method of claim 1 wherein the repetition time $T_R$ and magnitude and direction of the modulating field gradient are selected so that applying the modulating field gradient results in the phase modulation varying between about $2\pi/3$ radians per voxel and about $4\pi/3$ per voxel radians along the direction of the modulating field gradient.

16. The method of claim 1 wherein the repetition time $T_R$ and magnitude and direction of the modulating field gradient are selected so that applying the modulating field gradient results in the phase modulation varying between about $3\pi/4$ radians per voxel and about $5\pi/4$ radians per voxel along the direction of the modulating field gradient.

17. The method of claim 1 wherein the repetition time $T_R$ and magnitude and direction of the modulating field gradient are selected so that applying the modulating field gradient results in the phase modulation varying by about $\pi$ radians per voxel along the direction of the modulating field gradient.

18. The method of claim 1 wherein the modulating field gradient is applied along the same direction as the one or more phase-encoding field-gradient pulses.

19. The method of claim 1 wherein the modulating field gradient is applied along the same direction as the one or more readout field-gradient pulses.

20. The method of claim 1 wherein the modulating field gradient is applied along the same direction as the one or more slice-selection field-gradient pulses.

21. The method of claim 1 wherein the modulating field gradient is applied during an entire duration of each repetition cycle of the pulse sequence.

22. The method of claim 1 wherein the modulating field gradient is applied during one or more portions of each repetition cycle of the pulse sequence and is absent from one or more remaining portions of each repetition cycle of the pulse sequence.

23. The method of claim 22 wherein the modulating field gradient is applied during one or more of the one or more phase-encoding field-gradient pulses.

24. The method of claim 22 wherein the modulating field gradient is applied during one or more of the one or more readout field-gradient pulses.

* * * * *